(12) United States Patent
Swenson

(10) Patent No.: US 10,713,118 B2
(45) Date of Patent: Jul. 14, 2020

(54) SINGLE EVENT LATCHUP RECOVERY WITH STATE PROTECTION

(71) Applicant: HAMILTON SUNDSTRAND CORPORATION, Charlotte, NC (US)

(72) Inventor: Joshua C. Swenson, Rockford, IL (US)

(73) Assignee: HAMILTON SUNDSTAND CORPORATION, Charlotte, NC (US)

( * ) Notice: Subject to any disclaimer, the term of this patent is extended or adjusted under 35 U.S.C. 154(b) by 148 days.

(21) Appl. No.: 15/917,523

(22) Filed: Mar. 9, 2018

(65) Prior Publication Data
US 2019/0278660 A1    Sep. 12, 2019

(51) Int. Cl.
| | | |
|---|---|---|
| G06F 11/00 | (2006.01) | |
| G06F 11/14 | (2006.01) | |
| G06F 11/07 | (2006.01) | |
| H03K 19/003 | (2006.01) | |
| H03K 17/24 | (2006.01) | |

(52) U.S. Cl.
CPC ...... *G06F 11/1441* (2013.01); *G06F 11/0757* (2013.01); *G06F 11/0793* (2013.01); *H03K 17/24* (2013.01); *H03K 19/00338* (2013.01); *G06F 11/076* (2013.01); *G06F 11/0736* (2013.01); *G06F 11/0796* (2013.01); *G06F 2201/805* (2013.01); *G06F 2201/82* (2013.01); *G06F 2201/86* (2013.01)

(58) Field of Classification Search
CPC ........... G06F 11/1441; G06F 2201/805; G06F 2201/82; G06F 2201/86
USPC ......................................................... 714/23
See application file for complete search history.

(56) References Cited

U.S. PATENT DOCUMENTS

| | | | |
|---|---|---|---|
| 5,341,497 A | | 8/1994 | Younger |
| 5,923,830 A | * | 7/1999 | Fuchs ................. G06F 11/1641 |
| | | | 714/11 |
| 5,993,039 A | | 11/1999 | Crill |
| 6,064,555 A | * | 5/2000 | Czajkowski .......... H01L 23/552 |
| | | | 257/E23.114 |
| 7,907,378 B2 | | 3/2011 | Julicher |
| 9,823,679 B2 | | 11/2017 | Wilberg et al. |

(Continued)

FOREIGN PATENT DOCUMENTS

DE      102015202473 A1    8/2015

OTHER PUBLICATIONS

European Search Report for Application No. 19161303.3, dated Aug. 12, 2019, 10 pages.

*Primary Examiner* — Yair Leibovich
(74) *Attorney, Agent, or Firm* — Cantor Colburn LLP

(57) ABSTRACT

An apparatus that includes a single event latchup (SEL) recovery circuit, a microprocessor operatively connected with the SEL recovery circuit, and an output maintenance circuit that maintains a state of the microprocessor prior to a power cycle of the microprocessor. The apparatus is configured to detect a SEL event or other fault via a watchdog circuit, initiate a power cycle of the microprocessor, retain a latch state from the microprocessor, and determine whether the microprocessor was restarted due to an SEL event. Responsive to determining that the microprocessor has failed to restart due to a persistent fault, the apparatus determines whether a prepower cycle limit is reached within a predetermined span of time, and selectively provide power to a load based on the latch state and the power cycle limit determination.

15 Claims, 2 Drawing Sheets

(56) References Cited

U.S. PATENT DOCUMENTS

| | | |
|---|---|---|
| 2006/0044723 A1 | 3/2006 | Beneditz et al. |
| 2007/0091527 A1 | 4/2007 | Julicher |
| 2008/0151456 A1* | 6/2008 | Julicher .............. G06F 1/28 |
| | | 361/93.4 |
| 2010/0268987 A1* | 10/2010 | Clark .............. G06F 9/3867 |
| | | 714/16 |
| 2012/0159269 A1* | 6/2012 | Ibe .............. G01R 31/31816 |
| | | 714/704 |
| 2015/0234696 A1 | 8/2015 | Wataru |
| 2017/0308441 A1 | 10/2017 | Dickey et al. |

\* cited by examiner

SINGLE EVENT LATCHUP RECOVERY WITH STATE PROTECTION

BACKGROUND

Exemplary embodiments pertain to the art of solid state power controllers, and more specifically, recovery from single event latchup with a state protection circuit.

Cosmic radiation can induce Single Event Latchup (SEL) in complex electronic devices. SELs are induced by causing conduction from the circuit to the substrate that results in a 4 layer device or SCR turning on and carrying common mode current from multiple paths through the substrate to ground. This 'latch' results in collapsing the local power supply around the fault and disrupting the ability of the circuit to function at all. The amount of circuitry affect depends on the location of the collapse and the power supply characteristics. In aerospace this may be a particular problem due to higher radiation intensities and system criticality. Certain flight paths have increasing probability of SEL due to global magnetic variances and/or atmospheric conditions. Further, SEL may become more likely at certain polar orientations where cosmic radiation intensity is higher.

Solid state power controllers (SSPCs) may switch power on and off to electrical loads (e.g., displays, components, etc.). The SSPCs may be controlled by Peripheral Interface Controllers (PICs) that monitor voltage and current status, and drive field effect transistor gates to turn the power on and off in the load circuits. SEL affecting the PICs may cause loss of control and protection of the SSPC and the SSPC output to shift from their proper state to an erroneous state.

SEL can only be cleared by a power cycle of the affected device. Known methods by necessity power cycle the control circuits resulting in a loss of control state. It is advantageous to maintain the control state during an SEL recovery to prevent system effects.

BRIEF DESCRIPTION

Disclosed is an apparatus that includes a single event latchup (SEL) recovery circuit, a microprocessor operatively connected with the SEL recovery circuit, and an output maintenance circuit that maintains a state of the microprocessor prior to a power cycle of the microprocessor. The apparatus is configured to detect a SEL event or other fault via a watchdog circuit, initiate a power cycle of the microprocessor, retain a latch state from the microprocessor, and determine whether the microprocessor was restarted due to an SEL event. Responsive to determining that the microprocessor has failed to restart due to a persistent fault, the apparatus determines whether a prepower cycle limit is reached within a predetermined span of time, and selectively provide power to a load based on the latch state and the power cycle limit determination.

In any prior apparatus, the watchdog circuit is configured to shut the power to the load off responsive to determining that the predetermined power cycle limit is reached within a predetermined span of time.

In any prior apparatus, selectively providing power to the load comprises transmitting a command state to a field effect transistor operable as part of a solid state power controller.

In any prior apparatus, the latch state comprises a normal operation state of the microprocessor, wherein the normal operation state is associated with a non-erroneous shut down and restart of the SEL recovery circuit.

In any prior apparatus, the latch state comprises a recovery state associated with a prior SEL event recovery, wherein the microprocessor has lost power due to an earlier SEL event within a predetermined span of time.

Also disclosed is a method for recovering a circuit after a single event latchup (SEL). The method includes: detecting a SEL event or other fault via a watchdog circuit; initiating a power cycle of a microprocessor; retaining a latch state from the microprocessor; determining, via the microprocessor and a latch mechanism, whether the microprocessor was restarted due to an SEL event; responsive to determining that the microprocessor has failed to restart due to a persistent fault, determining whether a predetermined power cycle limit is reached within a predetermined span of time; and selectively providing power to a load based on the latch state and the power cycle limit determination.

In the method of any prior embodiment, the watchdog circuit is configured to shut the power to the load off responsive to determining that the predetermined power cycle limit is reached within a predetermined span of time.

In the method of any prior embodiment, selectively providing power to the load comprises transmitting a command state to a field effect transistor operable as part of a solid state power controller.

In the method of any prior embodiment, the latch state comprises a normal operation state of the microprocessor, wherein the normal operation state is associated with a non-erroneous shut down and restart of the SEL recovery circuit.

In the method of any prior embodiment, the latch state comprises a recovery state associated with a prior SEL event recovery, wherein the microprocessor has lost power due to an earlier SEL event within a predetermined span of time.

Also disclosed is a nontransitory computer readable storage medium storing instructions that, when executed by a processor, perform a method for recovering a circuit after a single event latchup (SEL). The method includes: detecting a SEL event or other fault via a watchdog circuit; initiating a power cycle of a microprocessor; retaining a latch state from the microprocessor; determining, via the microprocessor and a latch mechanism, whether the microprocessor was restarted due to an SEL event; responsive to determining that the microprocessor has failed to restart due to a persistent fault, determining whether a predetermined power cycle limit is reached within a predetermined span of time; and selectively providing power to a load based on the latch state and the power cycle limit determination.

In the nontransitory computer-readable storage medium of any prior embodiment, the watchdog circuit is configured to shut the power to the load off responsive to determining that the predetermined power cycle limit is reached within a predetermined span of time.

In the nontransitory computer-readable storage medium of any prior embodiment, selectively providing power to the load comprises transmitting a command state to a field effect transistor operable as part of a solid state power controller.

In the nontransitory computer-readable storage medium of any prior embodiment, the latch state comprises a normal operation state of the microprocessor, wherein the normal operation state is associated with a non-erroneous shut down and restart of the SEL recovery circuit.

In the nontransitory computer-readable storage medium of any prior embodiment, the latch state comprises a recovery state associated with a prior SEL event recovery, wherein the microprocessor has lost power due to an earlier SEL event within a predetermined span of time.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Single Event Effects (SEEs) are caused by a single, energetic particle. SEEs can be soft errors or hard errors. Soft errors can include, for example, a Single Event Upset (SEU), which is usually non-destructive and can be cleared by a reset pulse to the microprocessor. An SEU can appear as s transient pulse in logic or support circuitry, or as a bit-flip in a memory cell or register. A hard error can include, for example, a Single Event Latchup (SEL), burnout of power components (e.g., MOSFETS), gate rupture, frozen bits, and noise in CCDs. An SEL that causes a high operating current that exceeds device specifications is potentially destructive. In situations, an SEL can only be cleared by restarting power to the microprocessor, including removing and then restoring power. A reset operation of the microprocessor would not be sufficient. However, the power cycle will cause a loss of the control state. It is currently known to provide a watchdog timer used to verify valid operation of the control circuitry. In this type of watchdog circuit, a controller puts out a regular pulse to confirm proper operation of the system. When the controller experiences an SEL event such that it can no longer function, the controller stops providing pulses. When the pulse is not sensed for a given length of time the Watchdog initiates a power cycle. Such a method is explained in U.S. Patent Application no. 2017/0308441 A1, which is incorporated herein by reference. It is advantageous, therefore, to provide a system for event latchup recovery with state protection and a counter included that limits the number of allowed power cycles to prevent oscillation in case of a hard (persisting) failure.

Figure 1:
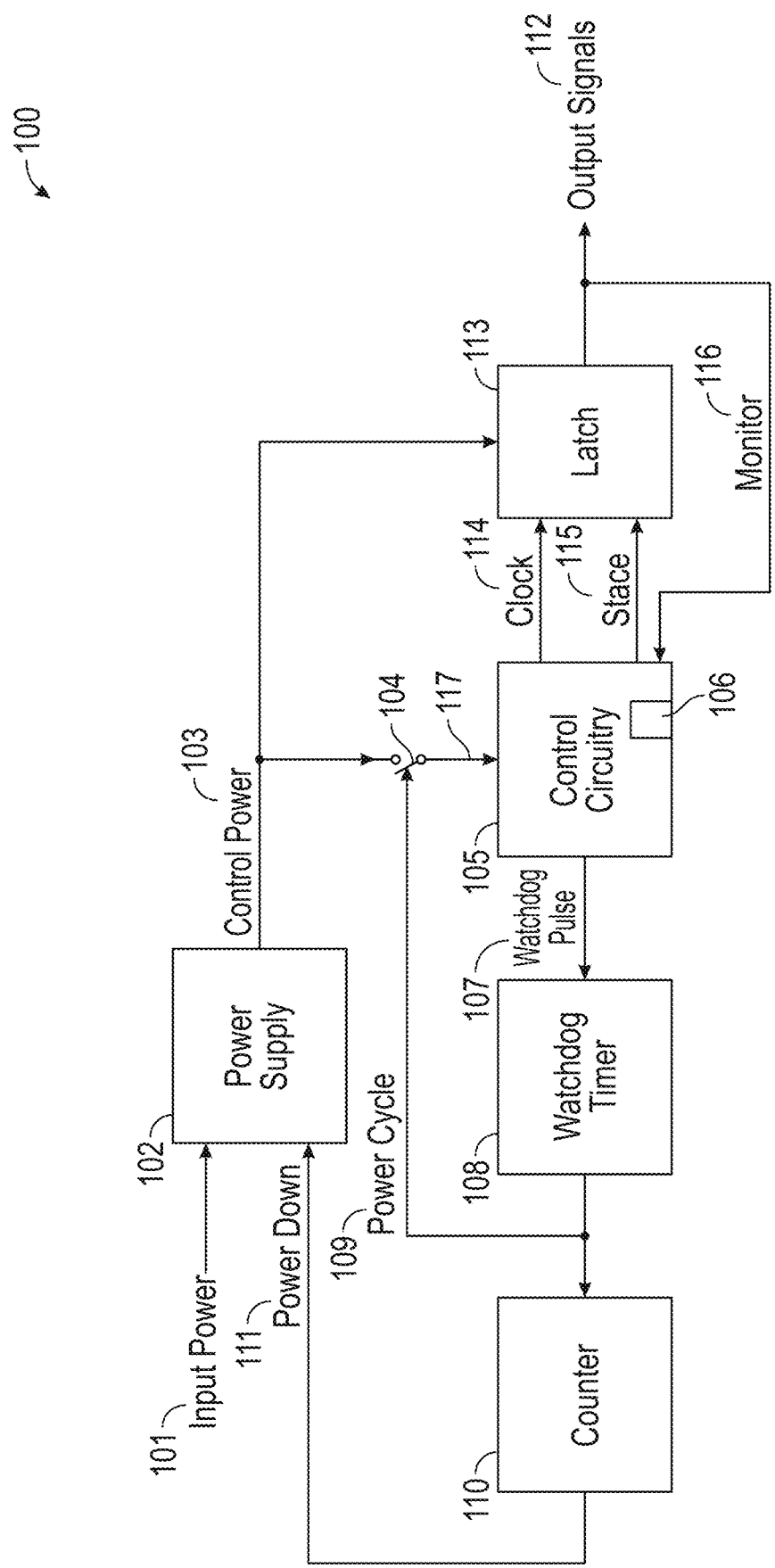
FIG. 1 is a flow diagram of a system for SEL event latchup recovery with state protection according to one embodiment.

FIG. 1 is a flow diagram of a system 100 for SEL event latchup recovery with state protection, according to an embodiment. Embodiments of the present invention improve the existing SEL recovery systems with minimal added circuitry. By memorizing the output state of the controller, the SEL recovery of the control circuitry can be concluded without disrupting the overall system operation. By limiting the total number of SEL recovery attempts and shutting down the controller and latched states if SEL recovery is unsuccessful, safety of the electronics with which system 100 is installed is maintained.

As shown in FIG. 1, the system 100 includes a power supply 102, a counting circuit (counter 110), a watchdog circuit (watchdog timer 108), control circuitry 105 having a microprocessor 106 (hereafter "controller 105" and microprocessor 106, respectively), and a latch mechanism 113.

The watchdog timer 108 detects a malfunction condition of the control circuitry 105, and in response to detecting a malfunction, triggers a power cycle operation of the microprocessor 106 by sending a power cycle pulse 109. A malfunction condition can be, for example, an occurrence of atmospheric radiation causing a latched state error of one or more CMOS devices operating in the control circuitry 105. While prior inventions may detect a SEL fault with a watchdog circuit, embodiments of the present invention protect and remember a state of a latch indicative of a state of the load prior to restarting. Accordingly, the load is not briefly lost due to a changed state in the microprocessor 106.

Responsive to an SEL event, the system 100 will cycle power to the control circuitry 105. The power cycle will cause the control circuitry 105 to stop operating for a period of time during and following the power cycle. The power is removed from the control circuitry 105 to remove the SEL and then restored allowing the control circuitry 105 to restart. The control circuitry 105 may require time to fully return to operation due to software loading and health checks upon restarting. During the period of time that the control circuitry 105 is not operable, the Latch 113 maintains the state of the load present prior to the SEL event. Additional latches 113 may be present to maintain other control circuit state data.

The microprocessor 106 upon power up may determine whether the power cycle was due to an SEL event or whether the power cycle is a non-SEL type restart (such as, for example, turning the system on for the first time) by reading the Latch 113 outputs via monitor signals 116. When the microprocessor 106 determines that the restart is due to an SEL event, according to embodiments, the system 100 is configured to 1) determine whether the system has recovered properly, 2) determine and remember the state prior to recovery power cycle, and 3) resume active control of the load.

At times, a persistent malfunction in the system may prevent the control circuitry 105 from restarting leading to multiple power cycles, where the system has not returned to a safe state after each power cycle. The persistent malfunction could cause the control circuitry 105 to repeatedly cycle on-off, on-off, etc., which may be damaging to the system 100. To prevent rapid power cycling in such cases, in response to a persistent malfunction condition, the watchdog circuit 108 may remove power from both the control circuitry 105 and the Latch circuitry 113. The microprocessor is thus maintained in a nonfunctional powered off state until maintenance of the hardware is performed. The counter 110 is configured to transmit a power down signal 111 to the power supply 102 if and only if a predetermined number of power cycles has been exceeded within a predetermined span of time. For example, the counter 110 may be configured to limit the system 100 to only 3 resets (power cycles of the control power 117) that shut off the control power 117 via a switch 104 and restore power to the control circuitry 105 via the switch 104 within a 60 second time period. After the third reset the counter 110 may be configured to cause the power supply 102 to turn off removing power 103 from both the control circuitry 105 and the latch circuitry 113. Removing power from the latch circuitry 113 ensures the load is placed in a safe off state when persistent faults prevent proper operation of the control circuitry 105. It should be appreciated that the predetermined number and predetermined time span are exemplary only and not limiting.

Recovering properly includes a full power cycle of the control circuitry 105, and restarting of system 100 software (operating as part of the control circuitry 105) where the controller acknowledges the current known state, appreciates whether the current state is a recovered state or a fresh restart state. In one case, the software or hardware fault causes an incomplete restart where the system software (not shown) operating in the control circuitry 105 fails to execute or executes with errors. After predetermined number of incomplete restart cycles resulting in an incomplete state recovery, the counter 110 shuts down the control circuitry 105 and latch 113.

The system 100 monitors the output signals 112 in a feedback loop (e.g., monitor signal 116) to determine what the control state was prior to power cycling. If the control circuitry 105 is operative without errors, the control circuitry 105 outputs a state signal 115 to the flip flop (described with respect to FIG. 2) indicative of a functional gate command, and outputs the clock signal 114 to the latch 113. With the clock signal 114 and the state signal 115, the latch 113 functions as a persistence mechanism that remembers the state of the control circuitry 105 prior to the reset.

Figure 2:
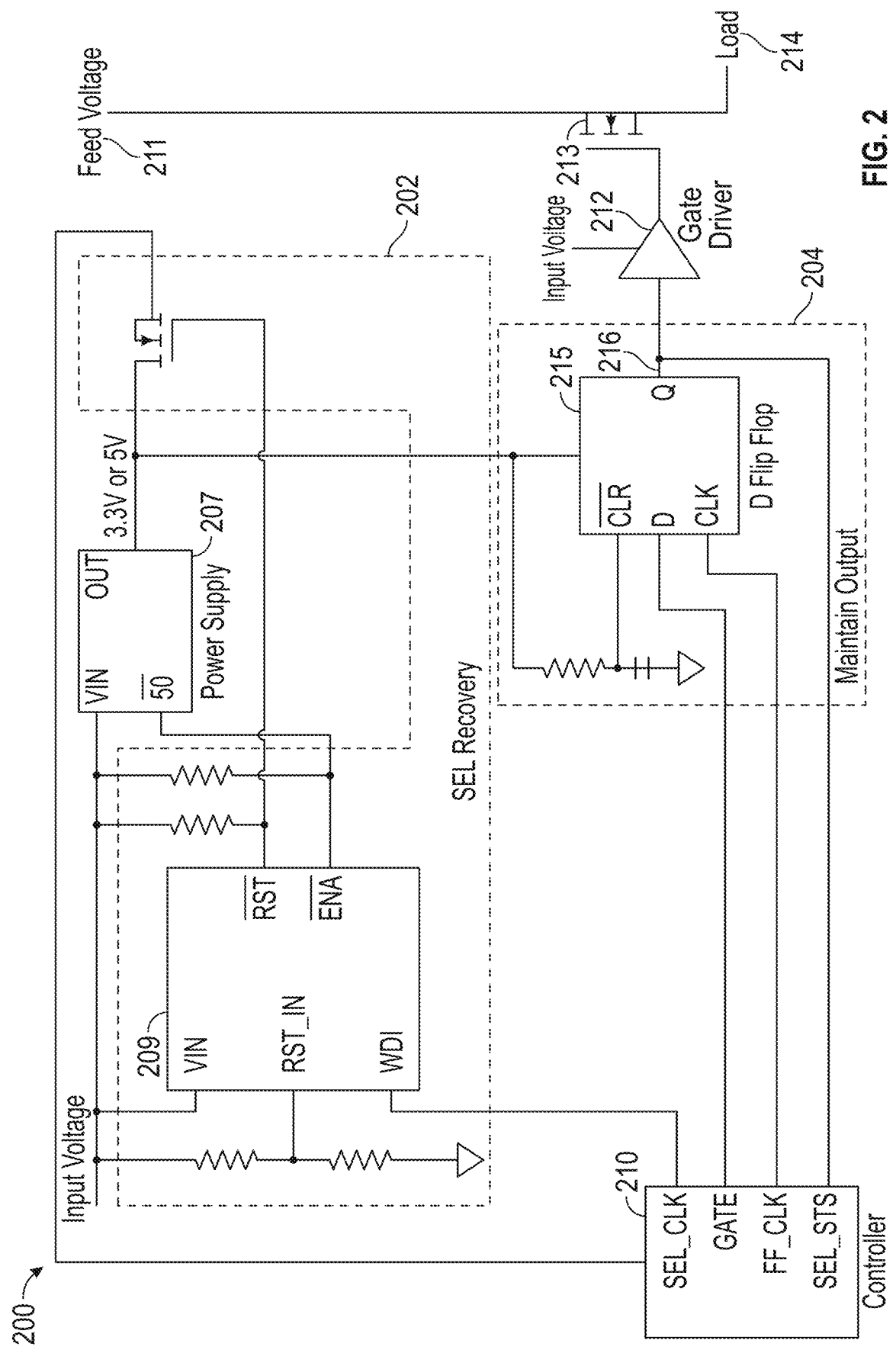
FIG. 2 is a diagram of a circuit for SEL event latchup recovery with state protection according to another embodiment.

FIG. 2 is a diagram of an exemplary circuit 200 for SEL event latchup recovery with state protection, according to another embodiment. The circuit 200 may be, for example, the circuit functional for the system 100 as shown in FIG. 1. FIGS. 1 and 2 are now considered in conjunction with one another, according to an embodiment. Referring now to FIG. 2, circuit 200 includes two main functional portions: an SEL recovery portion 202, and an output maintenance circuit 204. The SEL recovery portion 202 includes a watchdog circuit 209 counter mechanism (e.g., the watchdog timer 108 and counter 110 as shown in FIG. 1), and a switch (e.g., the switch 104 as shown in FIG. 1) configured to receive signals from the watchdog circuit 209 (e.g., power cycle pulse 109 as shown in FIG. 1) and remove power from the controller 210 and then restore power to the controller 210. Responsive to determining that the circuit 200 has not restarted properly due to multiple power cycle attempts, the watchdog circuit 209 sends a shutdown signal (e.g., power down 111 as shown in FIG. 1) to the power supply 207.

The circuit 200 further includes the output maintenance circuit 204 configured to remember the prior state of the system before a restart. The states can include, for example, 1) the output states of the system 100, 2) a normal operation state associated with a non-erroneous shut down and restart of the control circuitry 105, and 3) a recovery state associated with a prior SEL event recovery where the control circuitry 105 has lost power due to an SEL event.

According to an embodiment, the flip flop 215, configured as the latch mechanism 113 of FIG. 1, receives the clock signal 114 and the state signal 115 from the controller 210 (operational as the control circuitry 105 and/or the microprocessor 106 of FIG. 1). The controller 210 determines the desired output state 216 during normal operation. If then a fault appears that leads the SEL recovery portion 202 to power cycle the controller 210, the flip flop 215 retains the output state 216. After restarting the controller 210 may read the previously set output state 216 via the monitor signal 116 in FIG. 1. The output state 216 of the flip flop 215 operates, via the gate driver 212, a switch 213 providing the voltage feed 211 to the load 214.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An apparatus comprising:
a single event latchup (SEL) recovery circuit;
a microprocessor operatively connected with the SEL recovery circuit, and an output maintenance circuit that maintains a state of the microprocessor prior to a power cycle of the microprocessor;
wherein the apparatus is configured to:
detect a SEL event or other fault via a watchdog circuit;
initiate a power cycle of the microprocessor;
retain a latch state from the microprocessor;
determine, via the microprocessor and a latch mechanism, whether the microprocessor was restarted due to an SEL event;
responsive to determining that the microprocessor has failed to restart due to a persistent fault, determine whether a predetermined power cycle limit is reached within a predetermined span of time; and
selectively provide power to a load based on the latch state and the predetermined power cycle limit determination.

2. The apparatus of claim 1, wherein the watchdog circuit is configured to shut the power to the load off responsive to determining that the predetermined power cycle limit is reached within a predetermined span of time.

3. The apparatus of claim 1, wherein selectively providing power to the load comprises transmitting a command state to a field effect transistor operable as part of a solid state power controller.

4. The apparatus of claim 1, wherein the latch state comprises a normal operation state of the microprocessor, wherein the normal operation state is associated with a non-erroneous shut down and restart of the SEL recovery circuit.

5. The apparatus of claim 1, wherein the latch state comprises a recovery state associated with a prior SEL event recovery, wherein the microprocessor has lost power due to an earlier SEL event within a predetermined span of time.

6. A method for recovering a circuit after a single event latchup (SEL) comprising:
detecting a SEL event or other fault via a watchdog circuit;
initiating a power cycle of a microprocessor;
retaining a latch state from the microprocessor;
determining, via the microprocessor and a latch mechanism, whether the microprocessor was restarted due to an SEL event;
responsive to determining that the microprocessor has failed to restart due to a persistent fault, determining whether a predetermined power cycle limit is reached within a predetermined span of time; and selectively providing power to a load based on the latch state and the predetermined power cycle limit determination.

7. The method of claim 6, wherein the watchdog circuit is configured to shut the power to the load off responsive to determining that the predetermined power cycle limit is reached within a predetermined span of time.

8. The method of claim 6, wherein selectively providing power to the load comprises transmitting a command state to a field effect transistor operable as part of a solid state power controller.

9. The method of claim 6, wherein the latch state comprises a normal operation state of the microprocessor, wherein the normal operation state is associated with a non-erroneous shut down and restart of a SEL recovery circuit.

10. The method of claim 6, wherein the latch state comprises a recovery state associated with a prior SEL event recovery, wherein the microprocessor has lost power due to an earlier SEL event within a predetermined span of time.

11. A nontransitory computer readable storage medium storing instructions that, when executed by a processor, perform a method for recovering a circuit after a single event latchup (SEL) comprising:

detecting a SEL event or other fault via a watchdog circuit;

initiating a power cycle of a microprocessor;

retaining a latch state from the microprocessor;

determining, via the microprocessor and a latch mechanism, whether the microprocessor was restarted due to an SEL event;

responsive to determining that the microprocessor has failed to restart due to a persistent fault, determining whether a predetermined power cycle limit is reached within a predetermined span of time; and selectively providing power to a load based on the latch state and the power cycle limit determination.

12. The nontransitory computer-readable storage medium of claim 11, wherein the watchdog circuit is configured to shut the power to the load off responsive to determining that the predetermined power cycle limit is reached within a predetermined span of time.

13. The nontransitory computer-readable storage medium of claim 11, wherein selectively providing power to the load comprises transmitting a command state to a field effect transistor operable as part of a solid state power controller.

14. The nontransitory computer-readable storage medium of claim 11, wherein the latch state comprises a normal operation state of the microprocessor, wherein the normal operation state is associated with a non-erroneous shut down and restart of a SEL recovery circuit.

15. The nontransitory computer-readable storage medium of claim 11, wherein the latch state comprises a recovery state associated with a prior SEL event recovery, wherein the microprocessor has lost power due to an earlier SEL event within a predetermined span of time.

* * * * *